United States Patent
Yang et al.

(10) Patent No.: US 9,959,067 B2
(45) Date of Patent: May 1, 2018

(54) MEMORY BLOCK ALLOCATION BY BLOCK HEALTH

(71) Applicant: SanDisk Technologies LLC, Plano, TX (US)

(72) Inventors: Niles Yang, Mountain View, CA (US); Jianmin Huang, San Carlos, CA (US); Swati Bakshi, Dublin, CA (US)

(73) Assignee: SanDisk Technologies LLC, Plano, TX (US)

( * ) Notice: Subject to any disclaimer, the term of this patent is extended or adjusted under 35 U.S.C. 154(b) by 186 days.

(21) Appl. No.: 14/613,718

(22) Filed: Feb. 4, 2015

(65) Prior Publication Data

US 2016/0224267 A1 Aug. 4, 2016

(51) Int. Cl.
| | |
|---|---|
| *G06F 12/02* | (2006.01) |
| *G06F 3/06* | (2006.01) |
| *G06F 11/08* | (2006.01) |
| *G11C 16/34* | (2006.01) |
| *G11C 29/00* | (2006.01) |
| *G11C 29/44* | (2006.01) |
| *G11C 29/52* | (2006.01) |
| *G11C 11/56* | (2006.01) |

(52) U.S. Cl.
CPC .......... *G06F 3/0631* (2013.01); *G06F 3/064* (2013.01); *G06F 3/0616* (2013.01); *G06F 3/0679* (2013.01); *G06F 11/08* (2013.01); *G11C 16/349* (2013.01); *G11C 29/00* (2013.01); *G11C 29/4401* (2013.01); *G11C 29/52* (2013.01); *G11C 29/76* (2013.01); *G11C 11/5642* (2013.01)

(58) Field of Classification Search
CPC .. G06F 12/00; G06F 12/0238; G06F 12/0246; G06F 12/0253; G06F 3/0679
USPC ......................................... 711/100, 103, 154
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,532,962 A | 7/1996 | Auclair et al. |
| 5,570,315 A | 10/1996 | Tanaka et al. |
| 5,595,924 A | 1/1997 | Yuan et al. |
| 5,661,053 A | 8/1997 | Yuan |
| 5,768,192 A | 6/1998 | Eitan |
| 5,903,495 A | 5/1999 | Takeuchi et al. |
| 6,011,725 A | 1/2000 | Eitan |
| 6,046,935 A | 4/2000 | Takeuchi et al. |
| 6,222,762 B1 | 4/2001 | Guterman et al. |

(Continued)

OTHER PUBLICATIONS

Eitan et al., "NROM: A Novel Localized Trapping, 2-Bit Nonvolatile Memory Cell," IEEE.Electron Device Letters, vol. 21, No. 11, Nov. 2000, pp. 543-545.

*Primary Examiner* — Tuan Thai
(74) *Attorney, Agent, or Firm* — Stoel Rives LLP

(57) ABSTRACT

An individual block health metric value calculated for each of a plurality of blocks from a combination of factors including at least program-erase cycle count and error rate is used to order the plurality of blocks in order of block health metric values in an ordered list. Subsequently, a block may be selected for use according to a position of the block in the ordered list.

21 Claims, 14 Drawing Sheets

(56) References Cited

U.S. PATENT DOCUMENTS

| | | | |
|---|---|---|---|
| 7,301,807 B2 | 11/2007 | Khalid et al. | |
| 7,954,037 B2 | 5/2011 | Lasser et al. | |
| 8,516,343 B2 | 8/2013 | Flynn et al. | |
| 8,533,550 B2 * | 9/2013 | Khan | G06F 3/0608 348/14.13 |
| 9,063,874 B2 | 6/2015 | Zhong et al. | |
| 9,170,897 B2 | 10/2015 | Losh et al. | |
| 9,213,594 B2 | 12/2015 | Strasser et al. | |
| 9,251,019 B2 | 2/2016 | Losh et al. | |
| 9,430,325 B2 * | 8/2016 | Liang | G06F 11/1068 |
| 2011/0131473 A1 | 6/2011 | Mokhlesi et al. | |
| 2012/0268994 A1 | 10/2012 | Nagashima | |
| 2013/0003480 A1 | 1/2013 | D'Abreu et al. | |
| 2013/0055012 A1 | 2/2013 | Roh | |
| 2013/0073924 A1 | 3/2013 | D'Abreu et al. | |
| 2014/0258587 A1 * | 9/2014 | Baryudin | G06F 12/0246 711/102 |
| 2015/0113207 A1 * | 4/2015 | Shin | G06F 12/0246 711/103 |
| 2016/0188424 A1 * | 6/2016 | Walls | G06F 11/1662 714/6.3 |

* cited by examiner

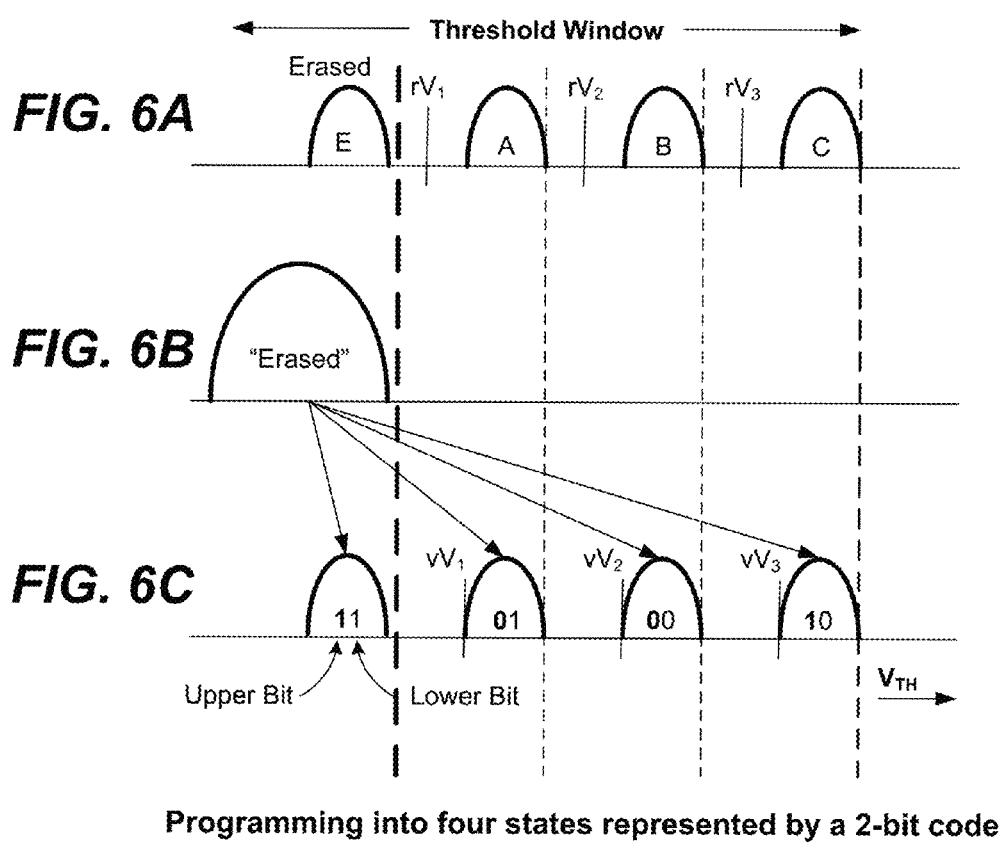
Programming into four states represented by a 2-bit code

| BHM array Index | BHM Values | Phy. Add (1) | PGM/ER Count (2) | Free block bit (1: available; 0: Used) | TRT last used | Notes |
|---|---|---|---|---|---|---|
| 1 | 1 | 0AEh | 35 | 1 | 23 | (best block) |
| 2 | 2 | 001h | 43 | 0 | 22 | |
| 3 | 3 | 45h | 87 | 1 | 33 | Higher DR needed |
| 4 | 3 | 7Dh | 89 | 0 | 23 | |
| 5 | 3 | 23h | 91 | 1 | 23 | |
| 6 | 6 | 546h | 56 | 1 | 23 | |
| 7 | 7 | null (*) | | | | |
| 8 | 8 | null (*) | | | | |
| 9 | 9 | null (*) | | | | |
| 10 | 10 | 567h | 88 | 1 | 22 | |
| ... | ... | | | | | |
| 2046 | 2046 | 09h | 67 | 1 | 22 | |
| 2047 | 2047 | 21h | 89 | 0 | 21 | |
| 2048 | 2048 | Afh | 99 | 1 | 23 | (worst block) |

(1): whenever there is a entry into the BHM array, the phy add is inserted.
(2): If the blocks have the same BHM, then the PEC can be used for the secondary indexing, so on.
*: not in use

*FIG. 12*

MEMORY BLOCK ALLOCATION BY BLOCK HEALTH

BACKGROUND

This application relates to the operation of re-programmable nonvolatile memory such as semiconductor flash memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) to be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is implemented by separately reading the binary states of the spatially separated charge storage regions within the dielectric.

Many nonvolatile memories are formed along a surface of a substrate (e.g. silicon substrate) as two dimensional (2D), or planar, memories. Other nonvolatile memories are three dimensional (3-D) memories that are monolithically formed in one or more physical levels of memory cells having active areas disposed above a substrate.

SUMMARY

In some nonvolatile block-erasable memory systems, an indicator of block health may be obtained from multiple factors such as Program Erase Count (PEC), Bit Error Rate (BER), and Block Operating Parameters (BOP), to better reflect block health than a single factor such as PEC. Blocks may then be allocated according to a multi-factor block health metric. Raw block health values for all blocks may be normalized and listed in order, with one or more tie-breakers used to assign each block to a unique position. The list is maintained and updated so that at any time that a block is to be allocated, a block with the best block health may found at the top of the list. Alternatively, a block may be picked from a different location in the list (e.g. a block that does not have the best block health may be selected for lower importance data so that blocks with the best block health are reserved for high priority data). An average block health for all blocks in a die may be maintained and may allow comparison of the relative health of different dies.

An example of a method of operating a nonvolatile memory includes: calculating an individual block health metric value for each of a plurality of blocks, a block health metric value for an individual block calculated from a combination of factors including at least program-erase cycle count and error rate; ordering the plurality of blocks in order of block health metric value in an ordered list; and subsequently, selecting a block for use from the ordered list according to a position of the block in the ordered list.

The block that is selected may have a block health metric value that is at an end of the ordered list. The block health metric value may indicate that the block has better block health than any other block on the ordered list. The method may include identifying one or more characteristics of data to be stored in the block and the block may be selected for use from the ordered list according to the one or more characteristics. The data to be stored may be identified as low priority data and in response the block that is selected from the ordered list may not be the block with the block health metric value that indicates that the block is in better condition than any other block on the ordered list. The data to be stored may be identified as high priority data and in response the block may be selected from the ordered list that is the block with the block health metric value that indicates that the block is in better condition than any other block on the ordered list. The plurality of blocks may be operated using different sets of operating parameters, each block assigned a set of operating parameters according to block characteristics, and the combination of factors may include an indicator of which set of operating parameters of a plurality of sets of operating parameters is assigned to the individual block. The plurality of blocks may be operated using different sets of operating parameters, each block assigned a set of operating parameters according to block characteristics, one or more characteristics of data to be stored in the block may be identified; and a most recently assigned set of operating parameters of the block may be replaced with a different set of operating parameters according to the one or more characteristics of data to be stored in the block. The data may be likely to be stored for an extended period of time and the different set of operating parameters may be selected to provide better data retention than the assigned set of operating parameters. When two or more blocks have individual block health metric values that are equal, the two or more blocks may be further ordered in the ordered block list according to one or more tie-breakers so that each of the plurality of blocks has a unique position in the ordered list. The nonvolatile memory may be a three dimensional memory that is monolithically formed in one or more physical levels of arrays of memory cells having an active area disposed above a silicon substrate.

A method of operating a nonvolatile memory may include: calculating an individual block health metric value for each of a plurality of blocks, a block health metric (BHM) value for an individual block being a function of Program-Erase Count (PEC), Bit Error Rate (BER), and Block Operating Parameters (BOP); ordering the plurality of blocks in order of block health metric value in an ordered list; and subsequently, selecting a block for use from the ordered list according to a position of the block in the ordered list.

An individual BHM value may be calculated from: BHM=a*PEC+b*BER+c*BOP, where factors a, b, and c, are weighting factors that are applied to all blocks. The ordering of the plurality of blocks may include normalizing individual BHM values. The ordered list may be maintained in a table that includes, for each of the plurality of blocks, a separate entry indicating block PEC, and an entry indicating if the block is available or written. The table may further include, for each of the plurality of blocks, a separate entry indicating a last assigned block BOP. In response to a determination that data is likely to be stored for an extended period of time, a selected block may be programmed using a block BOP that is not the last assigned block BOP without modifying the entry indicating the last assigned block BOP. The plurality of blocks may be located in a memory die, a running average of BHM values of the plurality of blocks in the memory die may be calculated; running averages of BHM values of other memory dies that are in the nonvolatile memory may be calculated; and a die may be selected based on a comparison of running averages of BHM values for memory dies in the nonvolatile memory.

An example of a nonvolatile memory system includes: a plurality of individually erasable blocks; an error rate calculation circuit that is configured to calculate an error rate for data stored in the nonvolatile memory; a program-erase cycle count circuit that is configured to count the number of program-erase cycles experienced by each of the plurality of individually erasable blocks; a block health metric calculator that is configured to, for each individual block of the plurality of blocks, calculate a block health metric value for the individual block from an error rate for data stored in the individual block as calculated by the error rate calculation circuit, and from a program-erase cycle count for the individual block obtained from the program-erase cycle count circuit; and an ordered block health metric list that contains individual entries for each of the plurality of individually erasable blocks, the individual entries ordered according to block health metric values calculated by the block health metric calculator for corresponding individually erasable blocks.

The memory system may be a NAND flash memory system comprising memory cells connected in series to form NAND strings. The nonvolatile memory may be a three dimensional memory that is monolithically formed in one or more physical levels of arrays of memory cells having an active area disposed above a silicon substrate.

Various aspects, advantages, features and embodiments are included in the following description of exemplary examples thereof, which description should be taken in conjunction with the accompanying drawings.

BRIEF DESCRIPTION OF THE DRAWINGS

FIGS. 6A-6C illustrate an example of programming a population of memory cells.

FIG. 12 illustrates an example of an ordered list of blocks by BHM value.

DETAILED DESCRIPTION

Memory System

Figure 1:
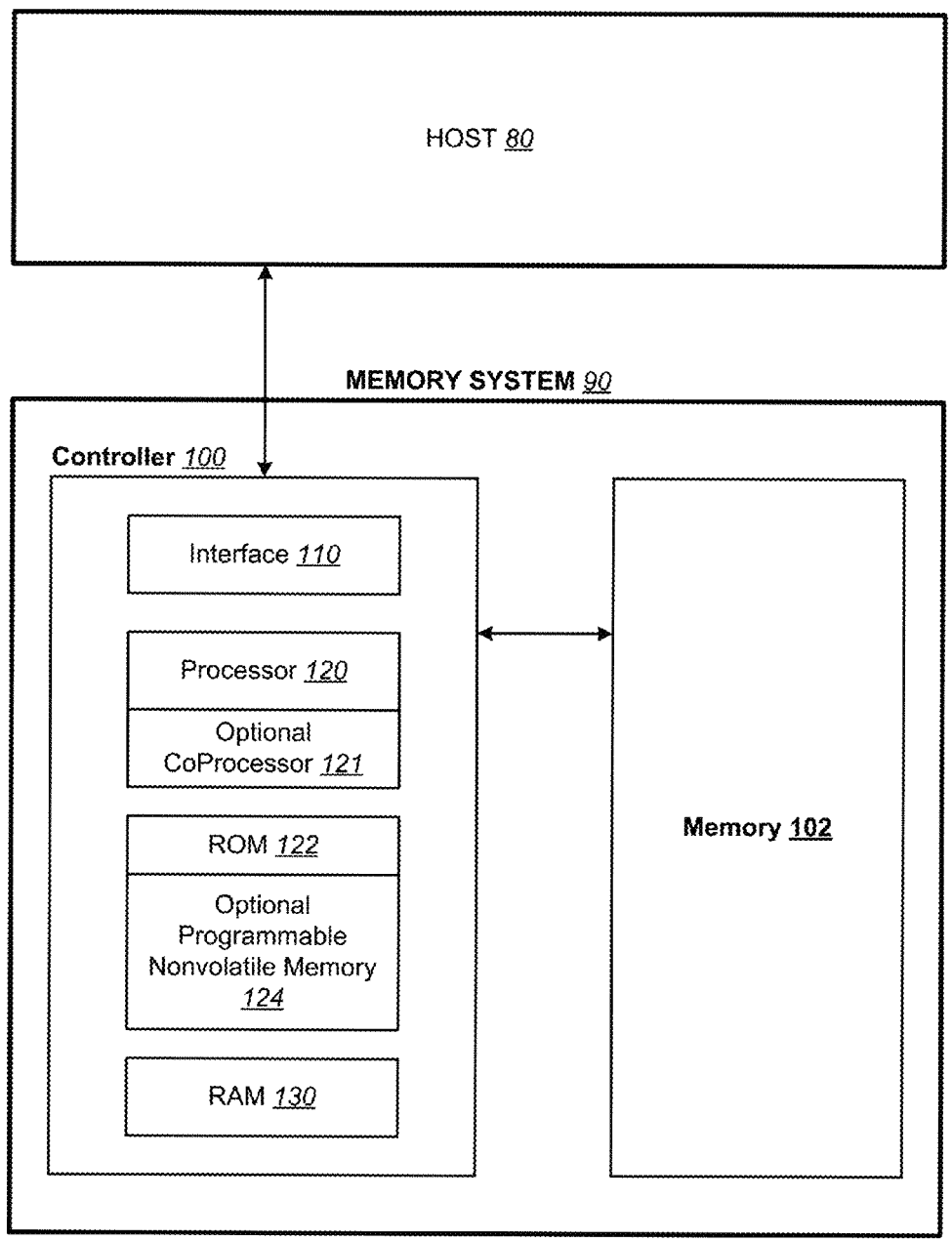
FIG. 1 illustrates schematically the main hardware components of a memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

FIG. 1 illustrates schematically the main hardware components of a memory system suitable for implementing some of the techniques described here The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Physical Memory Structure

Figure 2:
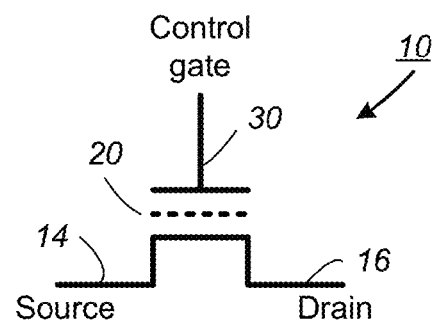
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
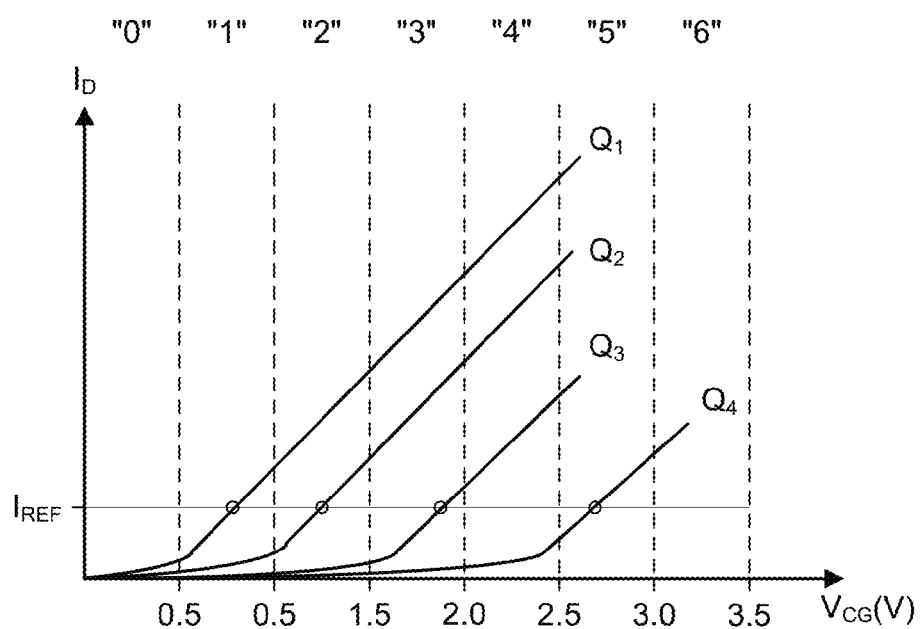
FIG. 3 illustrates the relation between the source-drain current $I_D$ and the control gate voltage $V_{CG}$ for four different charges Q1-Q4 that a floating gate may store.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
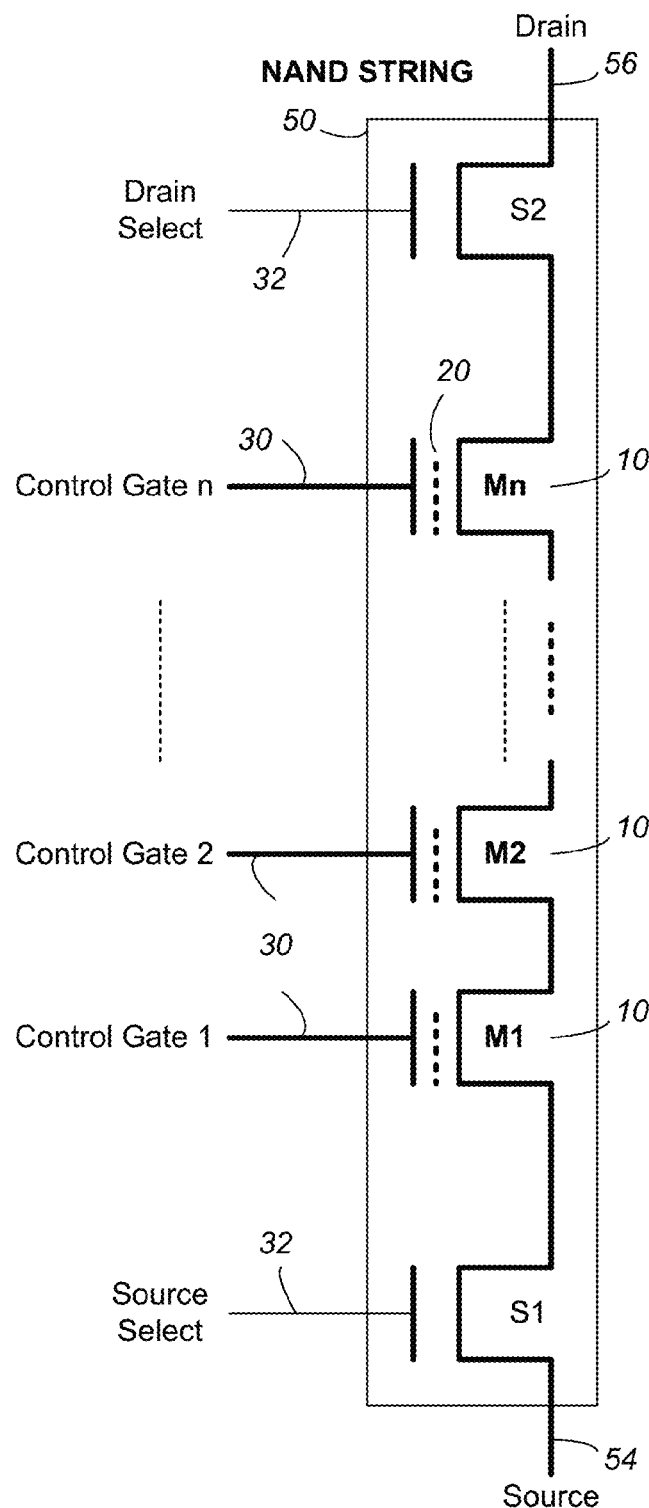
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 4B:
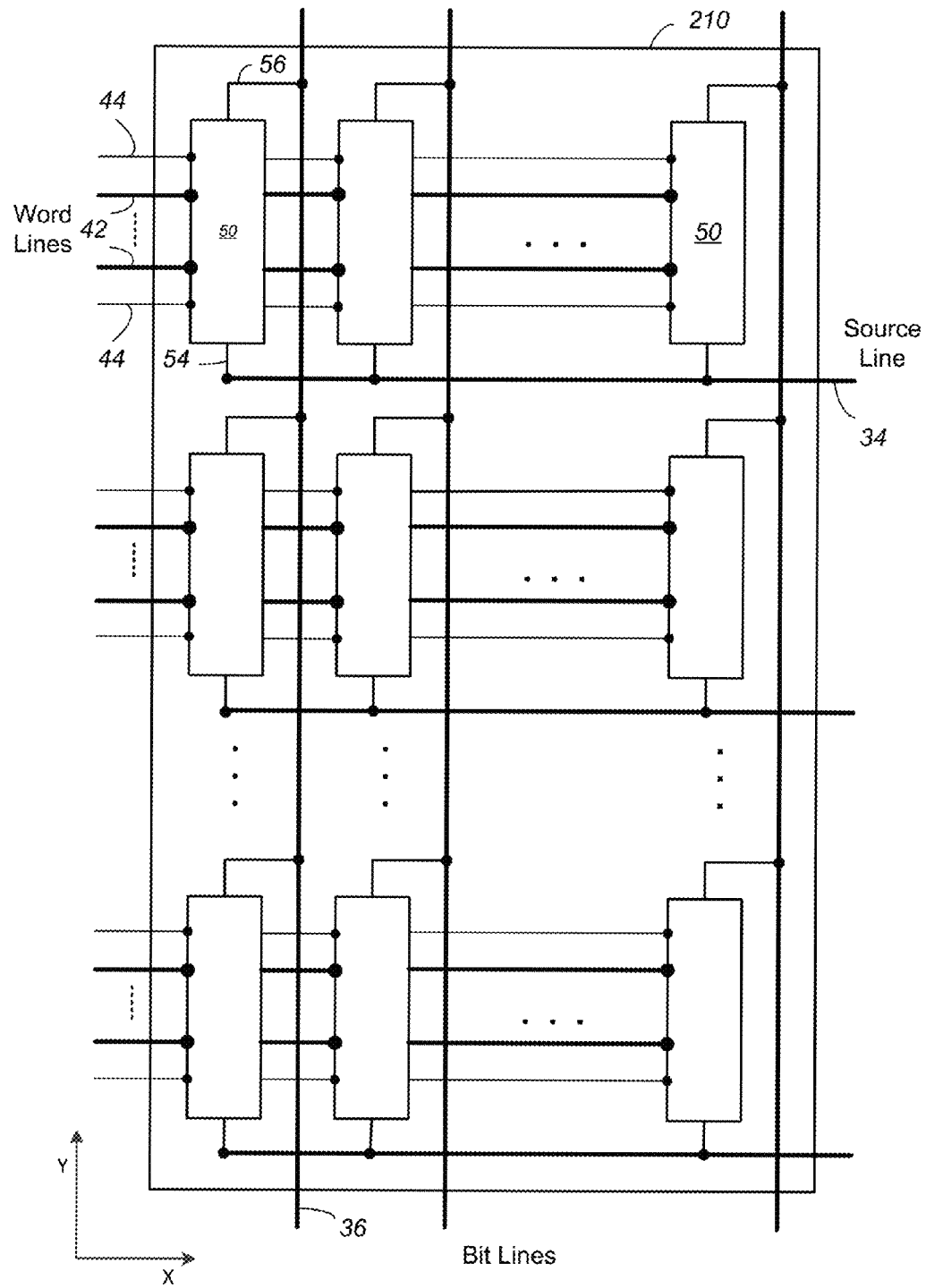
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
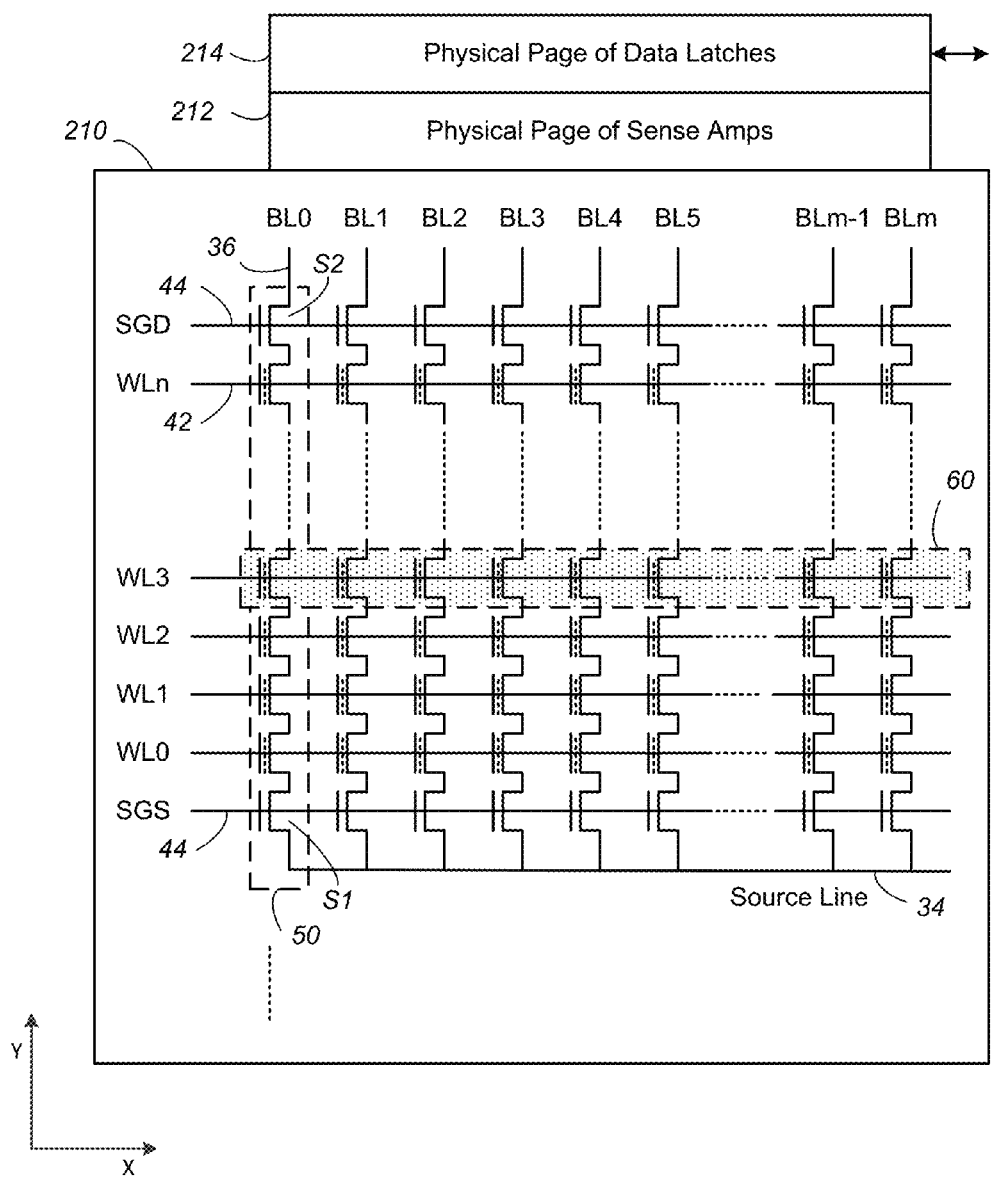
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a flash memory cell is generally programmed from the erased state. That is the floating gate is generally first emptied of charge. Programming then adds a desired amount of charge back to the floating gate. Flash memory does not generally support removing a portion of the charge from the floating gate to go from a more programmed state to a lesser one. This means that updated data cannot overwrite existing data and is instead written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell (a Single Level Cell, or SLC" memory), one physical page stores one logical page of data. In memories that store two bits per cell, a physical page stores two logical pages. The number of logical pages stored in a physical page thus reflects the number of bits stored per cell. The term Multi Level Cell, or "MLC" is generally used to refer to memories that store more than one bit per cell, including memories that store three bits per cell (TLC), four bits per cell, or more bits per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 7:
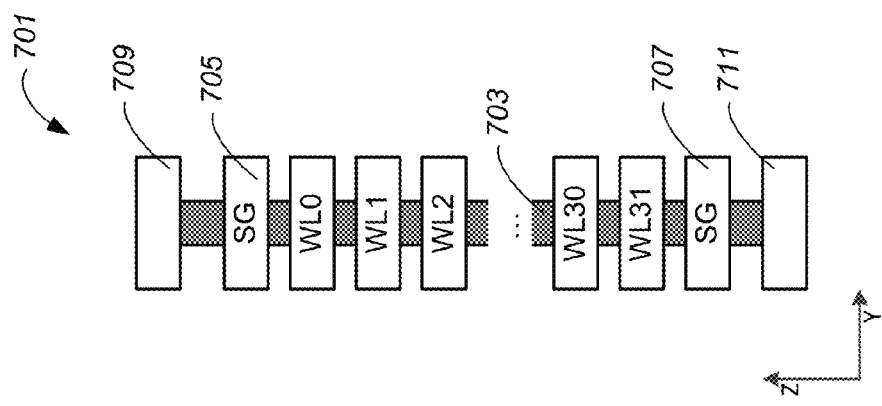
FIG. 7 shows an example of a physical structure of a 3-D NAND string.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both Single Level Cell (SLC) and Multi Level Cell (MLC) operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
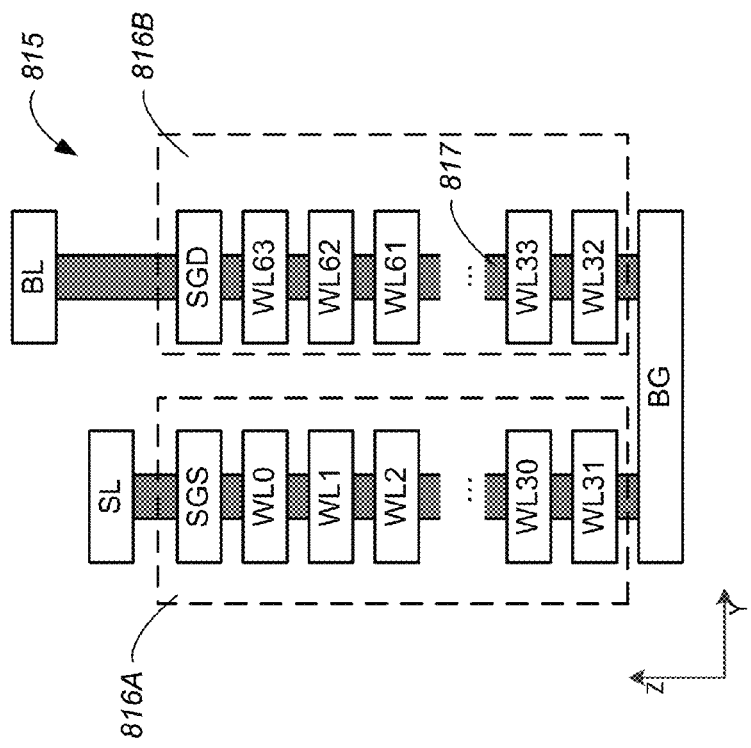
FIG. 8 shows an example of a physical structure of a U-shaped 3-D NAND string.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
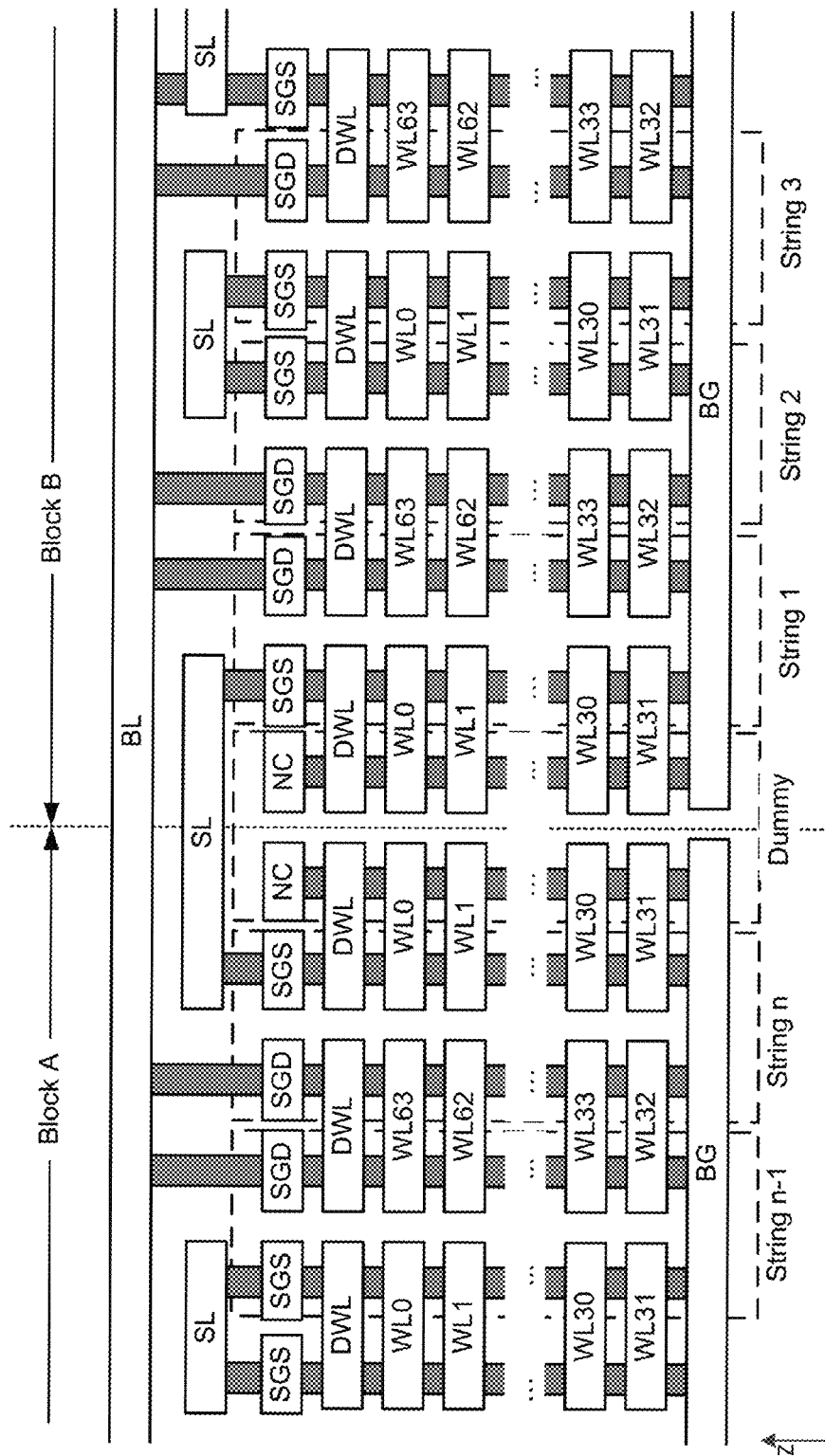
FIG. 9 shows an example of a cross section of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n strings (String 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 10:
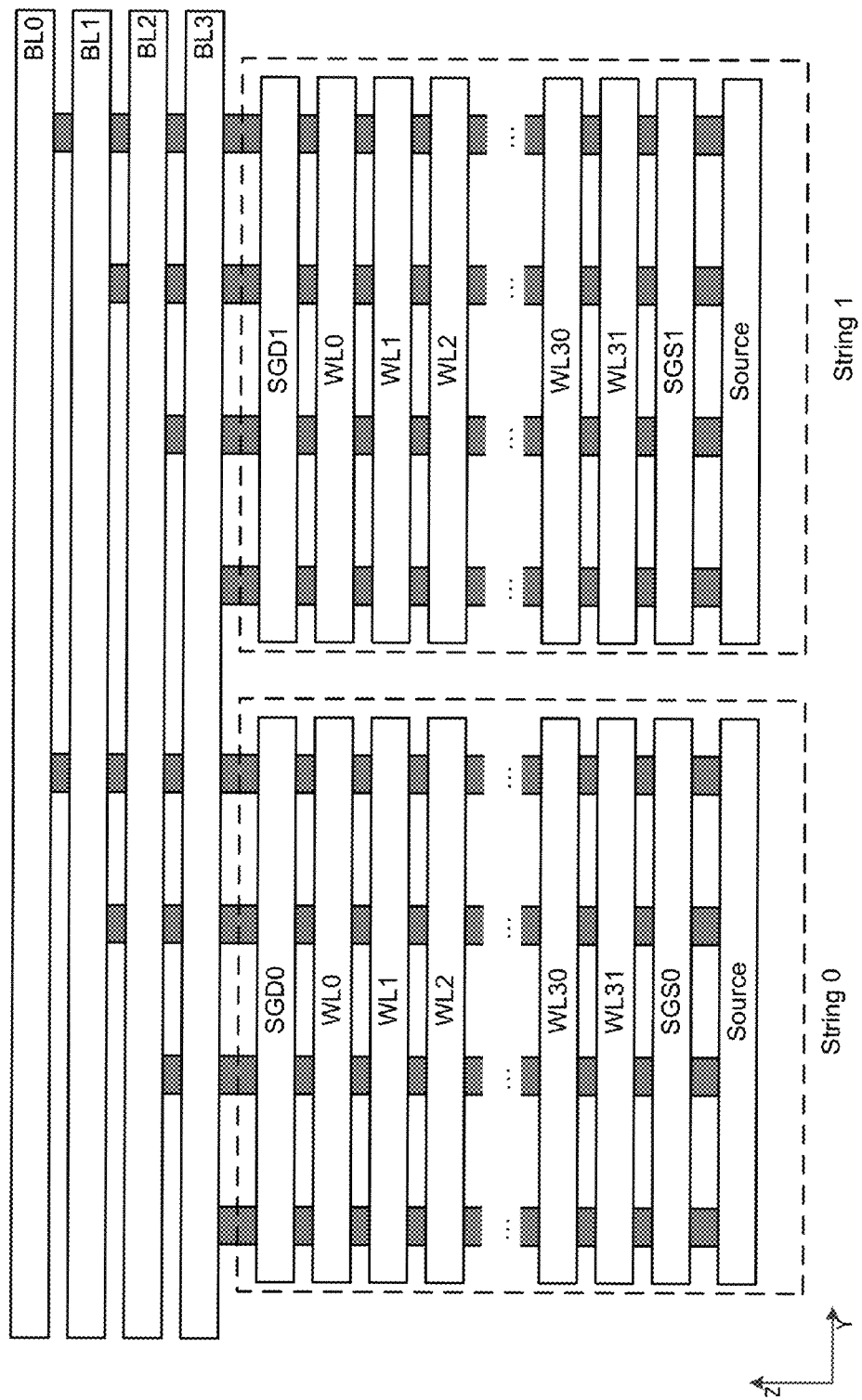
FIG. 10 shows an example of a cross section of a 3-D NAND memory with straight NAND strings in the y-z plane.

FIG. 10 shows a memory structure in which straight vertical NAND strings extend from common source connections in or near a substrate to global bit lines (BL0-BL3) that extend over the physical levels of memory cells. Word lines in a given physical level in a block are formed from a sheet of conductive material. Memory hole structures extend down through these sheets of conductive material to form memory cells. Within a given block there are multiple NAND strings connected to a given bit line. NAND strings are grouped into sets of strings that share common select gates. Thus, for example, NAND strings that are selected by SGS0 and SGD0 may be considered a set and may be designated as String 0, while NAND strings that are selected by SGS1 and SGD1 may be considered as a set and may be designated as String 1 as shown. A block may consist of any suitable number of such sets of strings. It will be understood that the cross-section of FIG. 10 shows portions of BL0-BL3, these bit lines extend further in the y-direction. Furthermore, additional bit lines extend parallel to BL0-BL3 (e.g. at different locations along x-axis, in front of, or behind the location of the cross-section of FIG. 10). Other three dimensional memories are based on resistive elements rather than charge storage elements.

Block Health

In general, NAND flash memory (both 3-D and planar NAND) is block erasable and certain memory management operations are performed on a block-by-block basis. A pool of erased blocks may be maintained so that they are available for storage of user data. When user data is to be stored, a block is chosen from the pool and allocated for the data. Physical blocks may not be identical and may not have identical operating characteristics. Differences may occur during manufacturing leading to different block characteristics from initialization. For example, write speeds, read speeds, erase speeds, error rates, power consumption, and other characteristics may vary from block to block. If a block's characteristics are outside specified limits then the block may be designated as a bad block and its location may be recorded in a bad block list. Bad blocks are generally discarded and not used for storage of user data. However, it is generally undesirable to discard blocks unnecessarily so that blocks may remain in use even if they have some undesirable characteristics, e.g. somewhat slow, or higher than average error rates. Some 3-D memory systems use very large blocks (large number of cells per block) so that discarding such blocks unnecessarily is particularly costly. Maintaining such blocks in operation, even when their characteristics vary greatly, may be worth some additional resources to operate blocks with varying characteristics.

In addition to differences between blocks that are present from initialization, other differences may emerge over time as a memory system is used. It is known that blocks of charge storage memory may change with use. A program-erase cycle (PEC) count may be maintained to measure the use, or wear, that a block has experienced. This may be used to apply wear-leveling operations that distribute wear evenly across blocks rather than allow wear to be concentrated in certain blocks which could cause those blocks to fail. However, different blocks may wear differently so that two blocks with the same PEC do not necessarily have similar characteristics and one such block may be closer to failure than the other.

In some memory systems, memory operation may adapt to changing block characteristics. For example, a set of Block Operating Parameters (BOP) may be selected for a block according to its condition. Block Operating Parameters may be referred to as "trimming tabs" or "TRT" and voltages applied during various operations may be trimmed according to the set of BOPs or trim tabs associated with the block. Various sets of BOPs may be assigned to blocks depending on block condition. In general, as blocks wear the BOPs used with the blocks are changed so that memory operation adapts to changing block characteristics. For example BOPs may be modified according to block PEC. Where BOPs are adaptive to changing block characteristics, the most recently assigned set of BOPs may be an indicator of block health.

Different blocks may have different error rates. In some memory systems, data is encoded by Error Correction Code (ECC) prior to storage in memory cells. When the data is read out from the memory it is decoded by ECC and any errors are detected and corrected (up to some limit). Error rates for a portion of memory may change over time and may reflect the health of the portion of memory. Monitoring the error rates in data from different blocks may allow average error rate to be estimated for different blocks, which can provide an indicator of block health. An average Bit Error Rate (BER) may be estimated for different blocks as an indicator of block health.

A general indicator of block health may be obtained from multiple factors. This may provide a better indicator of block health than a single factor (e.g. better than PEC alone, or BER alone). For example, a block health metric may be obtained by combining factors such as PEC, BER, and BOP. Each factor may be weighted appropriately. Appropriate weighting may depend on the type of memory (e.g. planar or 3-D, charge-storage or resistive, dimensions, materials, etc.).

An example of an equation for calculating a Block Health Metric (BHM) value from multiple factors is:

$$BHM=a*PEC+b*BER+c*BOP$$

Weighting factors a, b, c may be chosen to generate a BHM value that accurately represents overall block health. For example, factors a, b, c may be found from testing of blocks to find values that best reflect probability of block failure, or may be found from modeling, or otherwise. BHM may also be based on more complex functions of factors. A BHM value obtained from multiple factors may be used for various purposes including adaptive operation of blocks as they change and allocation of blocks for storage of data.

Block Allocation

When a free block is to be selected for storage of data, there may be a pool of free blocks to choose from. One scheme allocates a free block with the lowest PEC in order to provide wear-leveling between blocks. However, the block with the lowest PEC is not always the block that is in the best condition. In some cases, a block with a low PEC may be in poor health, and may be close to failure. Such a condition may be indicated by another factor such as a high BER.

A scheme for allocating blocks based on a multi-factor BHM value may more accurately select blocks according to their condition and may result in fewer block failures. However, a complex multi-factor selection process may take significant time and could result in increased write time where block selection is performed in response to receiving a write command.

An example of a scheme for allocating blocks based on a multi-factor BHM metric maintains an ordered, or ranked, list of blocks according to their multi-factor BHM so that a block can be selected directly from the list without performing an analysis of multiple factors whenever a new block is selected.

Figure 11:
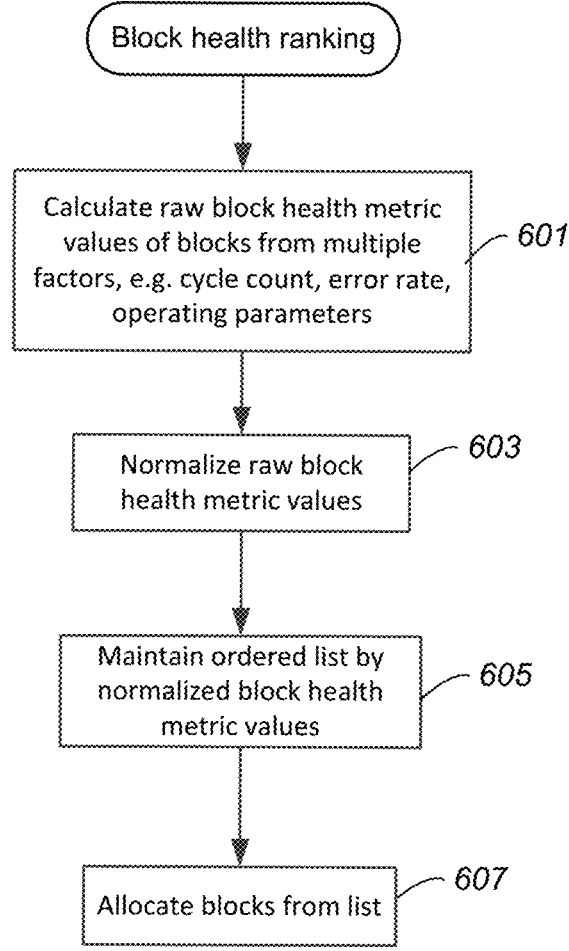
FIG. 11 illustrates an example of block health ranking.

FIG. 11 illustrates an example of a scheme for block health ranking that allows allocation of blocks according to a multi-factor BHM in a rapid manner so that high write speeds may be maintained. A raw BHM value is calculated 601 for blocks from multiple factors such as cycle count, error rate, and operating parameters. These factors (and other factors in some cases) may be combined using appropriate weightings so that the BHM value provides a good representation of overall block health. The raw BHM values are then normalized 603. A list is maintained in which blocks are ordered by their normalized BHM values 605. Subsequently, when a block is needed (e.g. because of a host write command) an appropriate block can be rapidly allocated from the list without performing complex multi-function analysis across a number of blocks.

Normalization may be performed for all blocks of a die based on raw BHM values ("raw_BHM") and the number of blocks in the die (n). For example, where there are n blocks in a die, and a maximum raw BHM is raw_BHM-max, normalized BHM may be given by the following equation:

$$\text{Normalized\_BHM} = n*(\text{raw\_BHM}/\text{raw\_BHM\_max})$$

Thus, the block BHM values of the die are normalized on a scale of 0-n. If multiple blocks have the same normalized block BHM value after this step then one or more tie-breakers may be used to assign unique rankings to blocks. For example, PEC may be used as a tie-breaker between blocks.

The ordered list may be updated to accurately reflect block health across a die. For example, when a block is erased, its PEC may be incremented which may trigger updating its BHM value including looking at all factors to calculate a new BHM value and new ranking.

Allocation of blocks may simply select the free block with the best BHM ranking (i.e. may simply take the block from the end of the list that reflects the best health—e.g. the top of the list). Thus, a block that has poor health moves down in ranking and is only used if there is no healthier free block. It will be understood that ranking blocks according to BHM rather than simply PEC means that the list reflects individual block health, not simply the wear that they have experienced. This difference may be significant where blocks deteriorate at different rates when exposed to the same wear (i.e. where blocks with the same PEC may show very different health). A block may remain highly ranked even with a high PEC if it continues to have a good BER or other factor. A block may be ranked low even with a low PEC if it has a poor BER or other factor.

FIG. 12 shows an example of an ordered list of blocks of a memory die. The memory die in this example contains 2048 blocks that are ranked from 1 to 2048 in order of BHM (position 1 indicating best health and 2048 indicating worst health in this example). BHM values are normalized to a scale from 1 to 2048 in this example so that there are a number of unique positions that is equal to the number of physical blocks in the die. Tie-breakers may be used to assign blocks to unique positions when they have identical raw BHM values. The physical address "Phy. Add" of blocks are recorded in the ordered list whenever a block is added to the list (e.g. when a block is first written and a BHM value is calculated). In some cases, all blocks are initiated according to data obtained during testing prior to storage of user data. Certain blocks contain a null entry in the physical address column (e.g. blocks 7-9), for example, because these are reserved blocks that are maintained as spares to replace bad blocks. Program Erase Count "PGM/ER Count" (PEC) is recorded in another column so that it is available for use, for example, as a tie-breaker or other purposes. A bit is maintained for each block indicating if the block is a free block (i.e. if the block is erased and available for writing of new data). A set of Block Operating Parameters (BOP) that were last assigned to each block "TRT last used" is recorded. Different sets of operating parameters may be used throughout the life of a block with parameters adapting to changes. BOPs may be assigned in sets that are selected from a list of BOP sets designated by numbers (e.g. 0-33). When a block is selected, the last assigned BOP entry may be read from the list and the corresponding BOP set may be used to program the block. When the BOP is changed (e.g. because of programming errors, read errors, erase fail, high BER or other reason) the list is updated to reflect the change.

In some cases, data that has specific needs may be programmed using a set of BOPs that are selected according to those needs. For example, in row 3, where data is likely to be stored for a long period of time higher data retention ("DR") may be desirable. Accordingly, a set of BOPs may be selected to facilitate better data retention. This change may be recorded in the list as the last assigned set of BOPs. Alternatively, the last assigned BOP set in the list may remain the same so that the block returns to the previous set of BOPs after the data with long data retention requirements is erased (i.e. BOP set for high DR may be used once after which operation returns to the last assigned BOP set). It will be understood that additional columns may also be present in a list such as an average BER for each block and/or other factors that may be used for calculating a BHM and/or for other purposes.

Figure 13:
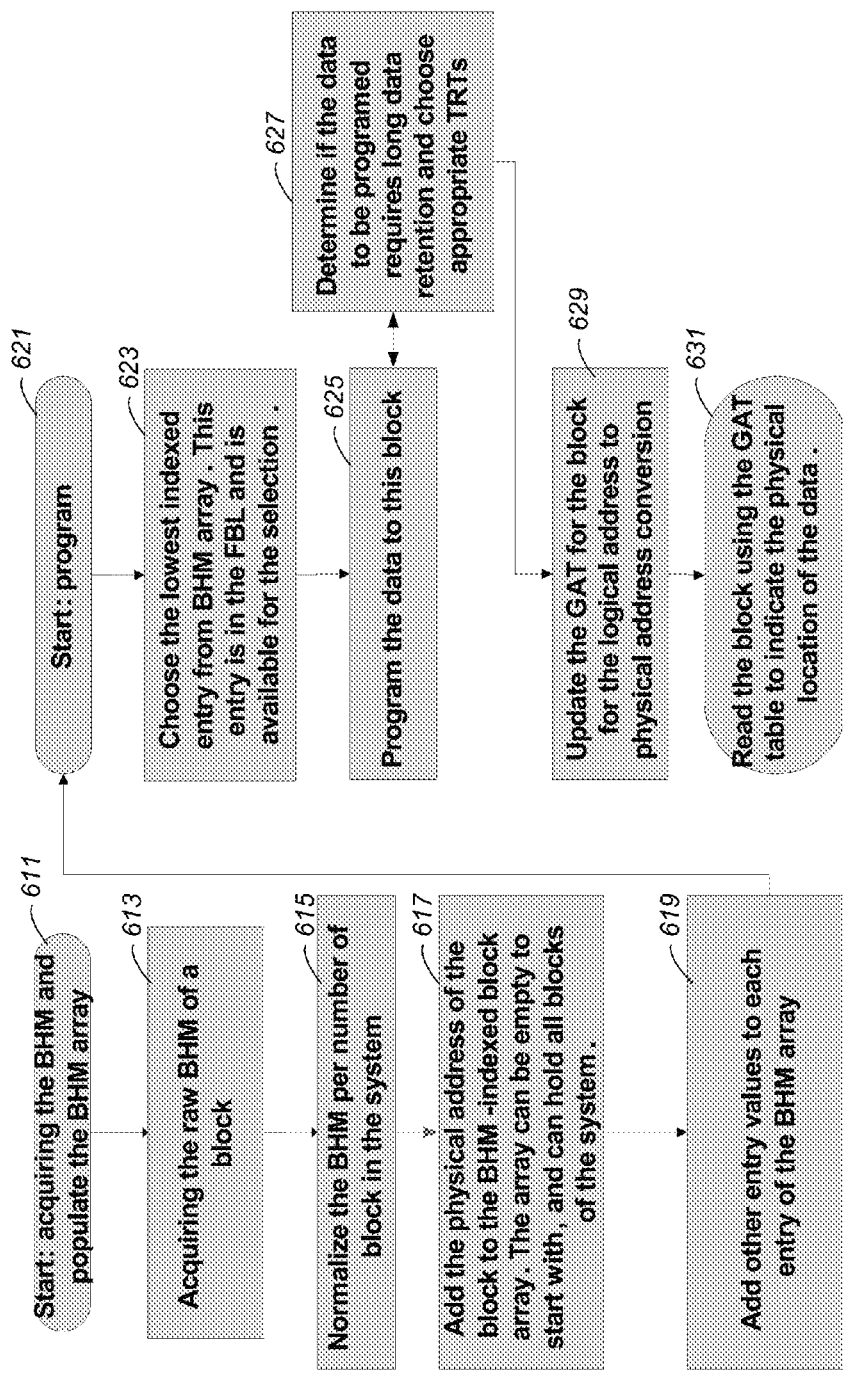
FIG. 13 shows steps in operating a block-erasable memory.

FIG. 13 illustrates a series of steps for allocation of blocks using multiple factors. BHM data is acquired and used to populate the BHM list or array 611. BHM data may be acquired during testing and/or during operation of the memory. A raw BHM value is obtained for a block 613 and is then normalized according to the number of blocks in the system 615 (e.g. number of blocks in the die containing the block). The physical address of each block is then added to the array 617 which contains a number of rows that is equal to the number of blocks in the system. Other entries such as PEC, BER, BOP, free block bit, etc. may be added as appropriate 619. Subsequently, when a block is to be allocated 621, the lowest indexed entry that is free (in free block list, FBL) is chosen 623. Data is programmed to the selected block 635. A BOP set (TRT) is selected for good data retention if the data is determined to require long data retention 627. Subsequently, data management structures are updated 629 to reflect the physical location of the data (in this example, a Group Allocation Table, or GAT, is updated). Subsequent reads of the data are directed to the physical location indicated by the GAT table 631.

In addition to allowing rapid selection of a block with the best BHM in a die, a ranked block list allows a block to be selected from a different position in the list (i.e. not from the top of the list). For example, highly ranked blocks may be reserved for high priority data and low priority data may be allocated to lower ranked blocks. Blocks may be categorized according to health and data may be stored in the appropriate category of block according to characteristics of the data. In other cases, different levels of redundancy may be applied according to the health of the block in which data is stored or other measures may be taken according to BHM rank.

In some cases, BHM values for individual blocks may be aggregated to obtain data regarding larger structures. For example, the BHM values for the blocks of a die may be aggregated by calculating an average, or median BHM value that indicates overall die health. In this way, indicators of the health of different dies may be obtained.

Figure 14:
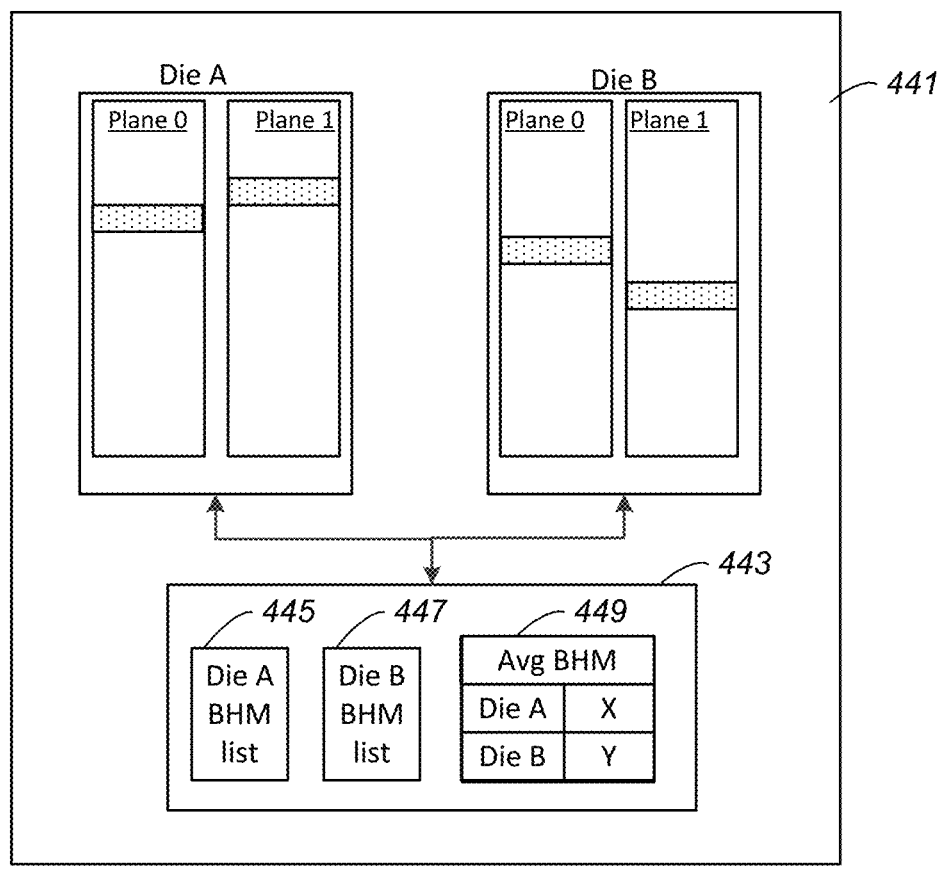
FIG. 14 illustrates maintaining average BHM for two dies.

FIG. 14 illustrates an example of a multi-die memory system 441 with two planes (plane 0 and plane 1) in each of two dies (Die A and Die B). A memory controller 443 maintains a ranked block list 445 for die A and a ranked block list for die B 447 according to a multi-factor BHM. In addition, the memory controller 443 maintains a record 449 of average block BHM value for each die so that if a single-die write is to be performed then the die with better BHM may be selected. In other examples, an average BHM value may be maintained for each plane so that a single-plane write may be directed to a plane with a good BHM metric. BHM values may be aggregated over multiple dies in a memory system so that overall system health may be monitored and adaptive measures may be taken on a system-wide basis.

Figure 15:
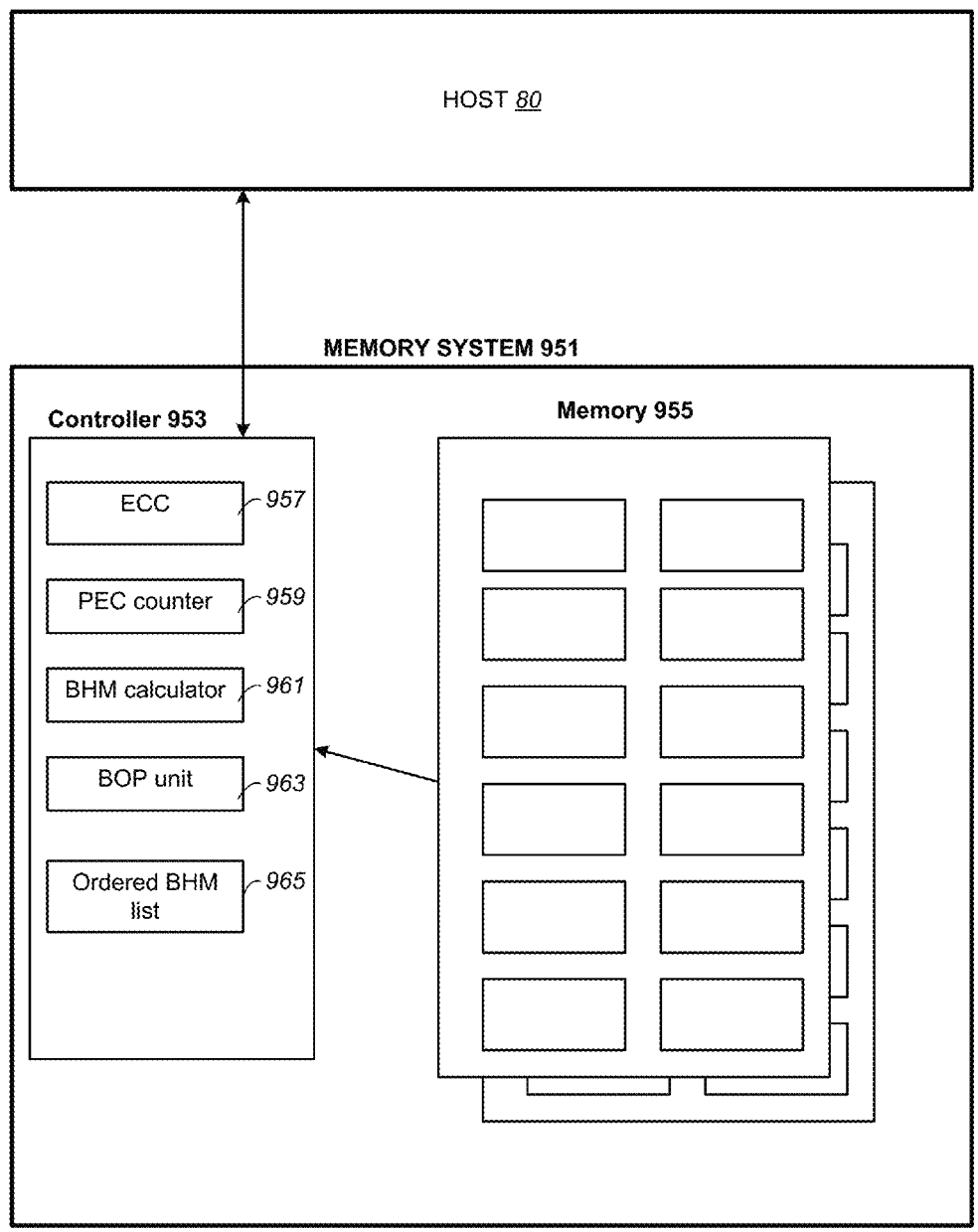
FIG. 15 illustrates a memory system using multi-factor BHM for block allocation.

FIG. 15 shows an example of a memory system 951 that may be used to implement aspects of the techniques described above. A memory 955, which may be a block-erasable charge-storage memory such as planar or 3-D NAND memory, contains multiple blocks that may be disposed on one or more memory dies. A memory controller 953 contains an ECC circuit 957 that is configured to encode and decode data and to calculate an error rate for data that is read from memory 955. A Program Erase Cycle (PEC) counter 959 is configured to count the number of program-erase cycles experienced by each block in memory 955. A Block Health Metric (BHM) calculator 961 is configured to calculate BHM values for each block from multiple factors including, for example, the block's error rate calculated by the ECC circuit, its PEC from the PEC counter. A BOP unit 963 applies different block operating parameters according to block condition. The last assigned set of BOPs may also be factored in when calculating BHM values for blocks. An ordered block health metric list 965 contains individual entries for each block of a die, the entries ordered according to block health metric values calculated by BHM calculator 961. Multiple such lists may be maintained in a multi-die system, one list per die. Average BHM for each die may also be maintained in a record or list. Lists may be maintained in volatile storage such as controller and may be saved to nonvolatile storage as needed. It will be understood that memory controller components may be formed as dedicated circuits (e.g. in an Application Specific Integrated Circuit, or ASIC), as configurable circuits (e.g. Programmable Logic Device, or PLD, Field Programmable Gate Array, FPGA, or other circuits), as circuits configured through software (e.g. firmware of a memory controller) or a combination of one or more of these approaches.

Conclusion

The foregoing detailed description has been presented for purposes of illustration and description. It is not intended to be exhaustive or to limit the attached claims. Many modifications and variations are possible in light of the above teaching.

It is claimed:

1. A method, comprising:
    calculating health metrics for blocks of a non-volatile memory, the health metric calculated for each block comprising a program-erase cycle count of the block and an error rate of the block;
    determining an ordering for the blocks based on the calculated health metrics of the blocks; and
    selecting a block for use in a write operation from a set of blocks that are available for writing based on the determined ordering of the blocks, the selected block having a program-erase count that is higher than a program-erase count of one or more other blocks of the set not selected for use in the write operation.

2. The method of claim 1, wherein:
    determining the ordering of the blocks comprises ordering the blocks by health metric in an ordered list; and
    selecting the block for use in the write operation comprises selecting the block from an end of the ordered list.

3. The method of claim 1, wherein a position of the block selected for use in the write operation indicates that the selected block has better block health than any other blocks of the set.

4. The method of claim 1, further comprising:
    identifying one or more characteristics of data to be stored in the write operation; and
    wherein the block is selected for use in the write operation according to a position of the block in the determined ordering and the identified characteristics of the data.

5. The method of claim 4, further comprising:
    identifying the data to be stored in the write operation as low priority data;
    wherein the block is selected from a position in the determined ordering that indicates that the selected block is not in better condition than all of the other blocks of the set.

6. The method of claim 4, further comprising:
    identifying the data to be stored in the write operation as high priority data;
    wherein the block is selected from a position in the determined ordering that indicates that the selected block is in better condition than any other of the blocks of the set.

7. The method of claim 1, further comprising
    operating the plurality of blocks using different sets of operating parameters, each block being assigned a set of operating parameters according to characteristics of the block,
    wherein the health metric calculated for each block further comprises an indicator of which set of operating parameters of a plurality of sets of operating parameters is assigned to the block.

8. The method of claim 1, wherein the blocks are operated using different sets of operating parameters, each block assigned a set of operating parameters according to characteristics of the block, the method further comprising:
    identifying one or more characteristics of data to be stored in a particular block of the non-volatile memory; and
    replacing a set of operating parameters assigned to the particular block with a different set of operating parameters according to the identified characteristics of the data.

9. The method of claim 8, further comprising:
    replacing the set of operating parameters assigned to the particular block with the different set of operating parameters in response to the identified characteristics of the data indicating that the data is likely to be stored in the particular block for an extended period of time.

10. The method of claim 1, wherein determining the ordering of the blocks further comprises:
    identifying two or more blocks having health metrics that are equal, and ordering the two or more blocks in the determining ordering according to one or more tie-breakers so that each of the two or more blocks has a unique position in the determined ordering.

11. The method of claim 1, wherein the non-volatile memory comprises a three-dimensional memory that is monolithically formed in one or more physical levels of arrays of memory storage elements having an active area disposed above a silicon substrate.

12. A method, comprising:
calculating a block health metric (BHM) value for each of a plurality of blocks of non-volatile memory storage elements, the BHM values quantifying a health of each block as a function of a Program-Erase Count (PEC) of the block and a Bit Error Rate (BER) of the block;
ranking the plurality of blocks in order of the BHM values calculated for each of the blocks from a healthiest block to a least-healthiest block, the healthiest block having a higher PEC count than one or more lower-ranked blocks in the ranking; and
selecting a block for use in a write operation based on the ranking, comprising selecting a highest-ranked block in a pool of free blocks, the highest-ranked block having a higher PEC than a PEC of one or more other blocks in the pool.

13. The method of claim 12, wherein the BHM value of each block of the plurality of blocks is calculated as:

BHM value of block=$a$*the PEC of the block+$b$*the BER of the block+$c$*a value corresponding to a set of Block Operating Parameters (BOPs) assigned to the block, where factors a, b, and c, are weighting factors.

14. The method of claim 12, wherein ranking the plurality of blocks comprises normalizing the BHM values of the blocks.

15. The method of claim 12, further comprising:
ranking the plurality of blocks by BHM in an ordered list; and
maintaining the ordered list in a table that includes an entry for each block, each entry comprising the PEC of the block and an indication of whether the block is available or written to.

16. The method of claim 15, further comprising:
assigning Block Operating Parameters (BOPs) to respective blocks based on characteristics of the respective blocks;
wherein the entry for each block further indicates the BOPs assigned to the block.

17. The method of claim 16, further comprising
determining that data associated with the write operation is likely to be stored for an extended period of time; and
in response to the determining, programming the selected block using BOPs that differ from BOPs indicated by an entry for the selected block without modifying the entry.

18. The method of claim 12, wherein the plurality of blocks are located within respective memory die of a plurality of memory dies, the method further comprising:
calculating a running average of BHM values of blocks within respective memory die of the plurality of memory dies;
and
selecting a memory die of the plurality of memory die based on a comparison of the running averages of the BHM values of the blocks within the respective memory dies.

19. A non-volatile memory system, comprising:
a plurality of blocks of non-volatile memory storage elements, wherein each block is individually erasable;
an error rate calculation circuit configured to calculate an error rate for each block;
a program-erase cycle count circuit configured to count program-erase cycles experienced by each block;
a block health metric calculator configured to calculate a multi-factor health metric for each of the blocks, the multi-factor health metric for each block comprising a combination of a plurality of block health factors, comprising the error rate of the block, as calculated by the error rate calculation circuit, and the program-erase cycle count of the block obtained from the program-erase cycle count circuit; and
control circuitry configured to:
generate an entry for each block, the entry for each block comprising the error rate of the block, the program-erase cycle count of the block, and the multi-factor health metric calculated for the block, the entries configured to distinguish free blocks that are available for use in write operations from programmed blocks;
determine a health ordering of the entries according to the multi-factor health metrics calculated for the corresponding blocks, such that a position of each entry in the determined health ordering indicates a relative health of the corresponding block compared to the plurality of blocks; and
select a block for use in a write operation from blocks identified as being free blocks by the entries, the control circuitry configured to select the block according to a position of an entry corresponding to the selected block in the determined health ordering, wherein a multi-factor health metric calculated for the selected block indicates that the selected block is a healthiest block of the free blocks, the selected block having a higher program-erase cycle count than one or more of the free blocks not selected for use in the write operation.

20. The non-volatile memory system of claim 19, wherein:
the non-volatile memory system comprises a NAND flash memory system, and
portions of the non-volatile memory storage elements are connected in series to form NAND strings.

21. The non-volatile memory system of claim 19, wherein the non-volatile memory comprises a three-dimensional memory that is monolithically formed in one or more physical levels of arrays of the non-volatile memory storage elements and having an active area disposed above a silicon substrate.

* * * * *